United States Patent [19]

Rosler et al.

[11] Patent Number: 4,557,943
[45] Date of Patent: Dec. 10, 1985

[54] METAL-SILICIDE DEPOSITION USING PLASMA-ENHANCED CHEMICAL VAPOR DEPOSITION

[75] Inventors: Richard S. Rosler, Paradise Valley; George M. Engle, Scottsdale, both of Ariz.

[73] Assignee: Advanced Semiconductor Materials America, Inc., Phoenix, Ariz.

[21] Appl. No.: 547,050

[22] Filed: Oct. 31, 1983

[51] Int. Cl.$^4$ .............................................. B05D 3/06
[52] U.S. Cl. ...................................... 427/38; 427/99; 427/126.1; 427/255.2; 427/376.2; 427/419.7
[58] Field of Search ....................... 427/38, 96, 99, 95, 427/126.1, 255.2, 255.7, 419.7, 376.2

[56] References Cited

U.S. PATENT DOCUMENTS 3,540,920 11/1970 Wakefield ......................... 427/255.2
3,658,577 4/1972 Wakefield ......................... 427/255.2
4,180,596 12/1979 Crowder et al. .................. 427/255.2
4,239,819 12/1980 Holzl ................................ 427/255.2
4,359,490 11/1982 Lehrer .............................. 427/255.2

FOREIGN PATENT DOCUMENTS 57-147431 9/1982 Japan ..................................... 427/38

OTHER PUBLICATIONS

Kuppers, "Recent Developments in Plasma Activated Chemical Vapor Deposition", Chem. Vapor Deposition, pp. 159–175, 1979, TS 695 157.

Primary Examiner—Sadie L. Childs
Attorney, Agent, or Firm—Weiss & Holloway

[57] ABSTRACT

A method for deposition of thin conductive layers of low resistivity titanium silicide. The method comprises the co-deposition of titanium and silicon by plasma-enhanced chemical vapor deposition at a low temperature. An anneal above the deposition temperature reduces the layer resistivity, making the layer especially suitable for microelectronic applications.

4 Claims, No Drawings

METAL-SILICIDE DEPOSITION USING PLASMA-ENHANCED CHEMICAL VAPOR DEPOSITION

BACKGROUND OF THE INVENTION

1. Field of the Invention

This invention relates to deposition of metal-silicide layers, and more specifically, to low temperature deposition of titanium-silicide layers using plasma-enhanced chemical vapor deposition.

2. Description of the Prior Art

In the past, integrated circuit devices have made extensive use of polysilicon layers, both as self-aligned gates for field-effect transistors and for electrical interconnects between various components. Traditionally, deposited polycrystalline silicon has been doped with conventional donor or acceptor elements to reduce its resistivity into the one milliohm-centimeter range. Since the film thickness is limited to about 0.5 microns maximum to permit patterning and reasonable step coverage, sheet resistances less than about 20 ohms per square are difficult to obtain. Such a value is too high for complex, high-performance integrated circuits because ohmic drops become too high. As a result, much effort has been devoted to the investigation of refractory metal silicides which have volume resistivities in the range 10-100 microohm-centimeters. Such values could enable sheet-resistances in the range of one ohm per square, enabling significant performance enhancement in integrated circuit applications.

While silicides of titanium, tantalum, tungsten, and molybdenum have been prepared by a number of techniques and have exhibited low resistivities, reproducibility of both resistivity and thickness has been poor, films have been hard to pattern, and the layer has been prone to peeling under thermal excursions. It is known to vacuum co-deposit silicon and a refractory metal and then react the mixture to form the metal silicide. Among other problems, a high temperature is usually required; this is undesirable from the standpoint of junction movement in shallow junction devices. Similarly, it is known to deposit refractory metal silicides from gaseous reactant species comprising silicon and a suitable refractory metal. Again, high temperatures may be required to get reaction, and since the gaseous species typically decompose at different temperatures, it is extremely difficult to get uniform deposition over a large number of work pieces. Furthermore, it is known to deposit a metal such as titanium onto various types of substrates using a plasma enhanced chemical vapor deposition system, however, in, for example, the publication entitled Titanium Deposition Onto Copper Substrates Using the Cold-Plasma Technique by Ruder et al which appears on Pages 339-343 of the 1982 Thin Solid Films (Volume 9) journal it is disclosed that the deposited layer of titanium was not very pure (copper and chlorine contaminants) and was porous. There is no disclosure in this publication of the need or desire to deposit a titanium silicide layer nor is there a disclosure or suggestion that any titanium alloy layer such as titanium silicide so deposited would be capable of annealing at a temperature as low as 600° C. and would also be substantially non-porous and of relatively high purity and be more easily reproducible in high volume production.

Thus, a need has existed to provide an economical method for the low-temperature deposition and annealing of refractory metal silicides having low resistivity, high purity, relatively low porosity, good reproducibility and uniformity, and otherwise suitable for use in microelectronic applications.

SUMMARY OF THE INVENTION

In accordance with one embodiment of this invention, it is an object thereof to provide a method for chemical vapor deposition of a low resistivity film comprising a refractory-metal silicide.

It is a further object of this invention to provide a method for chemical vapor deposition of titanium silicide.

It is another object of this invention to provide a method of chemical vapor deposition of titanium silicide at relatively low temperatures.

It is still another object of this invention to provide a method for chemical vapor deposition of reproducible titanium silicide layers of low sheet resistivity.

It is yet another object of this invention to provide a method for providing a low-resistivity conductive film comprising titanium silicide suitable for microelectronic applications.

BRIEF DESCRIPTION OF THE INVENTION

In accordance with one embodiment of this invention, there is disclosed a method for low-pressure plasma-enhanced chemical vapor deposition of a low-resistivity film comprising a refractory-metal silicide.

In accordance with another embodiment of this invention, there is disclosed a method for low pressure plasma-enhanced chemical vapor deposition of a low-resistivity film comprising titanium silicide.

In accordance with yet another embodiment of this invention, there is disclosed a method for low-pressure plasma-enhanced chemical vapor deposition of a composite film comprising silicon and titanium silicide layers to provide low-resistivity, adherent, and finely-patterned conductive layers for use in microelectronic fabrication.

The foregoing and other objects, features, and advantages of the invention will be apparent from the following, more particular description of the invention.

THE SPECIFICATION

According to a first preferred embodiment of this invention, a film of titanium silicide which is substantially titanium disilicide is deposited by chemical vapor deposition by reacting a gaseous silicon species and a gaseous titanium species in a plasma. The preferred reactant species are silane ($SiH_4$) and titanium tetrachloride ($TiCl_4$) which are carried into a reaction chamber by an inert gaseous carrier such as argon. Since $SiH_4$ and $TiCl_4$ decomposes at different temperatures, thermal decomposition is inadequate to produce films of uniform composition and thickness over an extended reaction zone. In accordance with this invention, the decomposition reaction takes place in a plasma at relatively low temperature by alternating electrical field by a process generally termed plasma-enhanced chemical vapor deposition (PECVD).

The starting point for the inventive method is the provision of an evacuable reaction chamber with means for supporting and heating the workpieces for the deposition, which may be, for example, microelectronic substrates. Such an apparatus is described in more detail by, for example U.S. Pat. No. 4,223,048 issued Sept. 16, 1980 to George Engle, a co-inventor of the present invention. In addition, the apparatus must have means for sustaining a plasma discharge in the vicinity of the workpieces. This is accomplished by applying a radio frequency signal across electrode proximate to the workpieces. The radio frequency signal is preferably pulsed at a rate comparable to the transmit time of the reactant species across the workpieces in order to achieve a uniform deposition over a large number of workpieces. More details of this technique may be found in U.S. Pat. No. 4,401,507 issued Aug. 30, 1983, also to George Engle.

The deposition takes place in a vacuum in the range of one torr. It has been found that satisfactory depositions may be achieved with $SiH_4/TiCl_4$ ratios in the range of 2 to 10. The combinations of small grain size and low resistivity has been achieved by deposition at 450 degrees C. followed by an atmospheric anneal in the vicinity of about 600 to about 700 degrees C. An advantage of this deposition is that it produces a relatively small grain size for the deposited titanium silicide film which is preferred for etchability and edge coverage considerations. Titanium silicide films 2000 Å thick typically have sheet resistances less than one ohm per square with such a process.

Typical microelectronics substrates have regions of exposed silicon and other regions comprising silicon covered with an insulator, such as a layer of silicon dioxide. It has been discovered that the sheet resistance of a given titanium silicide deposition is lower over silicon than over oxide, perhaps due to silicon incorporation during the anneal process. Also, the titanium silicide is more likely to be hazy or peel when deposited over oxide. To optimize the deposition for the microelectronic application, it has been found expedient to deposit a thin layer—e.g. 300 to 600 Å—of amorphous silicon prior to the silicide deposition. Similarly a thin layer of amorphous silicon—e.g. 300 Å—following the silicide deposition serves to isolate the silicide portion from the deleterious effects of oxygen or nitrogen during the 650 deg. C. anneal. Prior to the deposition it has been found efficacious to heat up the workpieces in hydrogen and to etch them in a $C_2F_6$ argon plasma for about four minutes. This procedure appears to reduce the haziness and increase the adherence of the deposited films.

Exemplary specific conditions for the deposition of a three layer film as described above are as follows:

| Layer | Temp C. | Pres. torr | $SiH_4$ flow sccm | $TiCL_4$ Flow sccm | Argon Flow sccm | R.F. on/off msec | Time min |
|---|---|---|---|---|---|---|---|
| 1 | 450 | .75 | 248 | 0 | 840 | 9/24 | 6 |
| 2 | 450 | .75 | 248 | 75 | 1200 | 11/35 | 18 |
| 3 | 450 | .75 | 248 | 0 | 840 | 9/24 | 3 |

This sequence yields a first layer of amorphous silicon about 600 Å thick, a second layer of titanium silicide of about 1800 Å thick, and a third layer of amorphous silicon about 300 Å thick. An advantage of the disclosed deposition process with its three separate deposited layers is that it adheres very well to an underlying substrate made of silicon or silicon dioxide. Following an ambient anneal at 650 deg. C., sheet resistivity was in the range of 0.5 to 1 ohm per square. Thinner layers of titanium silicide gave higher sheet resistivity. The sheet resistivity was insensitive to $TiCl_4$ flows in the range 30–90 sccm, but the 75 sccm value gave the clearest films after annealing. Analysis of the deposited film showed virtually no oxygen concentration, and a silicon/titanium ratio very close to two.

Based on the measured resistance value of one ohm per square and the 1800 Å thickness of the titanium silicide, its resistivity is less than 18 microohm-centimeter, which is substantially the value obtained with bulk titanium disilicide reacted at much higher temperatures. Based on the total thickness of 2400 Å for the three-layer conductive film, its average resistivity is less than 24 microohm-centimeter. Thus thin films having low sheet resistance are obtainable by the deposition method described hereinbefore.

While the invention has been particularly shown and described with reference to preferred embodiments thereof, it will be understood by those skilled in the art that various modifications may be made in much of the form and detail described without departing from the spirit and scope of the invention, which is limited only by the following claims.

We claim:

1. A method for the chemical vapor deposition of a low-resistivity composite layer comprising titanium silicide on a substrate by low-pressure plasma-enhanced vapor deposition, comprising the steps of:
   depositing a thin layer of silicon on said substrate;
   depositing a layer of titanium silicide on said thin layer of silicon by reacting a gaseous silicon species and a gaseous titanium species in a low-pressure plasma; and
   depositing another layer of silicon on said layer of titanium silicide.

2. The method of claim 1, where said gaseous silicon species comprises silane and said gaseous titanium species comprises titanium tetrachloride.

3. The method of claim 1, further including annealing said composite conductive layer at a temperature higher than the temperature at which said deposition steps are effected.

4. The method of claim 3 wherein said annealing is at a temperature of about 600° to about 700° C.

* * * * *